United States Patent
Kawada et al.

(10) Patent No.: US 7,682,991 B2
(45) Date of Patent: Mar. 23, 2010

(54) METHOD OF MANUFACTURING SILICON CARBIDE SEMICONDUCTOR DEVICE

(75) Inventors: Yasuyuki Kawada, Matsumoto (JP); Takeshi Tawara, Matsumoto (JP); Tae Tawara, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/960,405

(22) Filed: Dec. 19, 2007

(65) Prior Publication Data

US 2008/0220620 A1   Sep. 11, 2008

(30) Foreign Application Priority Data

Dec. 21, 2006 (JP) ............... 2006-344802
Nov. 13, 2007 (JP) ............... 2007-294194

(51) Int. Cl.
 *H01L 21/336* (2006.01)
 *H01L 29/78* (2006.01)
 *H01L 29/12* (2006.01)

(52) U.S. Cl. ............ 438/796; 438/700; 438/701; 438/702; 438/713; 438/715; 438/718; 438/734; 438/735; 438/795; 257/E21.182; 257/E21.27; 257/E21.312; 257/E21.226; 257/E21.229; 257/E21.549; 257/E21.605

(58) Field of Classification Search ............ 438/795, 438/9, 12, 700–702, 718, 734–735, 796, 438/713, 715; 257/E21.182, E21.27, E21.312, 257/E21.226, E21.229, E21.605, E21.549
See application file for complete search history.

(56) References Cited

U.S. PATENT DOCUMENTS

| 4,981,551 | A | * | 1/1991 | Palmour | 438/712 |
| 5,129,991 | A | * | 7/1992 | Gilton | 216/66 |
| 5,234,537 | A | * | 8/1993 | Nagano et al. | 216/67 |
| 5,571,374 | A | * | 11/1996 | Thero et al. | 438/718 |
| 7,241,694 | B2 | * | 7/2007 | Takeuchi et al. | 438/700 |
| 2002/0158301 | A1 | * | 10/2002 | Urakami et al. | 257/510 |
| 2003/0219948 | A1 | * | 11/2003 | Kuribayashi | 438/270 |
| 2005/0106794 | A1 | * | 5/2005 | Kuribayashi et al. | 438/197 |
| 2005/0233539 | A1 | * | 10/2005 | Takeuchi et al. | 438/400 |

FOREIGN PATENT DOCUMENTS

| JP | 2003-229479 A | | 8/2003 |
| JP | 2003229479 A | * | 8/2003 |
| JP | 2005-328013 A | | 11/2005 |
| JP | 2005-328014 A | | 11/2005 |
| JP | 2005328013 A | * | 11/2005 |
| JP | 2005328014 A | * | 11/2005 |

* cited by examiner

*Primary Examiner*—Zandra Smith
*Assistant Examiner*—Jeremy J Joy
(74) *Attorney, Agent, or Firm*—Rossi, Kimms & McDowell LLP

(57) ABSTRACT

A method of manufacturing a silicon carbide semiconductor device includes forming a trench for a MOS gate in an SiC substrate by dry etching. Thereafter, the substrate with the trench is heat treated. The heat treatment includes heating the substrate in an Ar gas atmosphere or in a mixed gas atmosphere containing $SiH_4$ and Ar at a temperature between 1600° C. and 1800° C., and thereafter in a hydrogen gas atmosphere at a temperature between 1400° C. and 1500° C. The present manufacturing method smoothens the trench inner surface and rounds the corners in the trench to prevent the electric field from localizing thereto.

4 Claims, 12 Drawing Sheets

FIG. 9
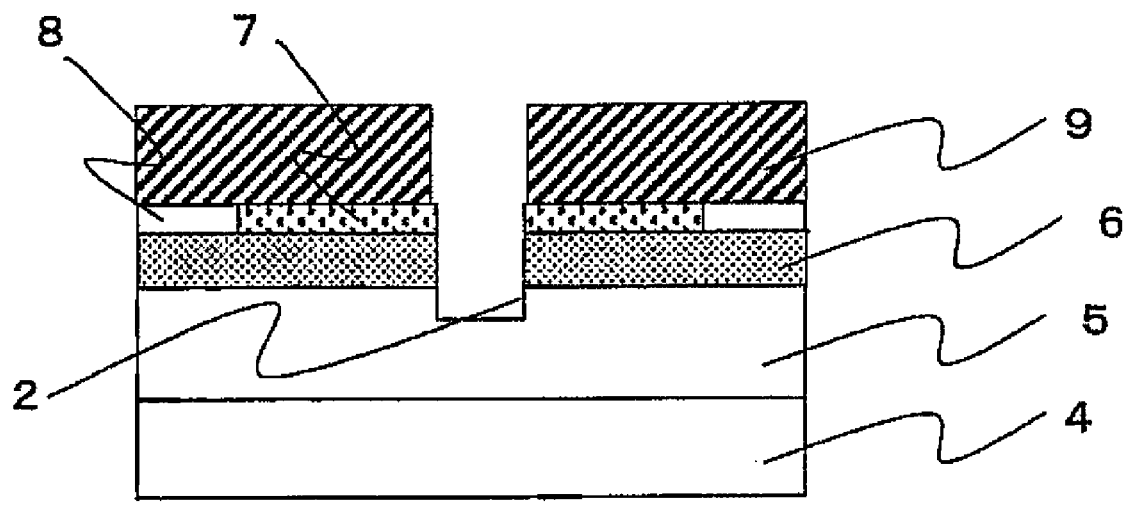
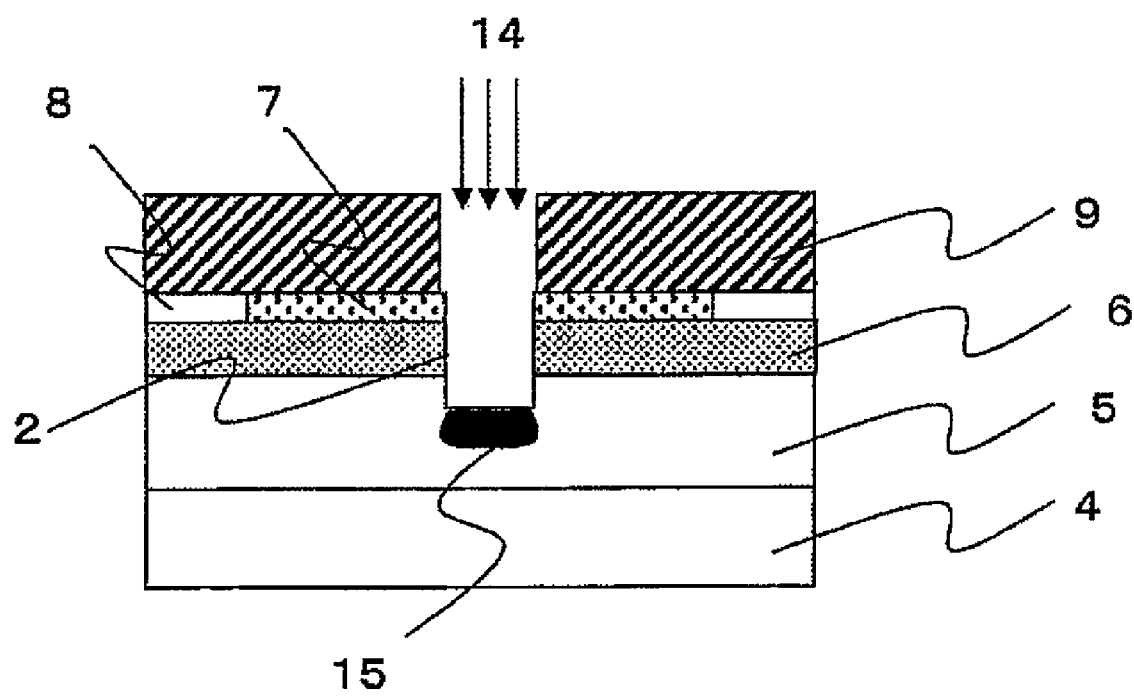
FIG. 10

FIG. 11
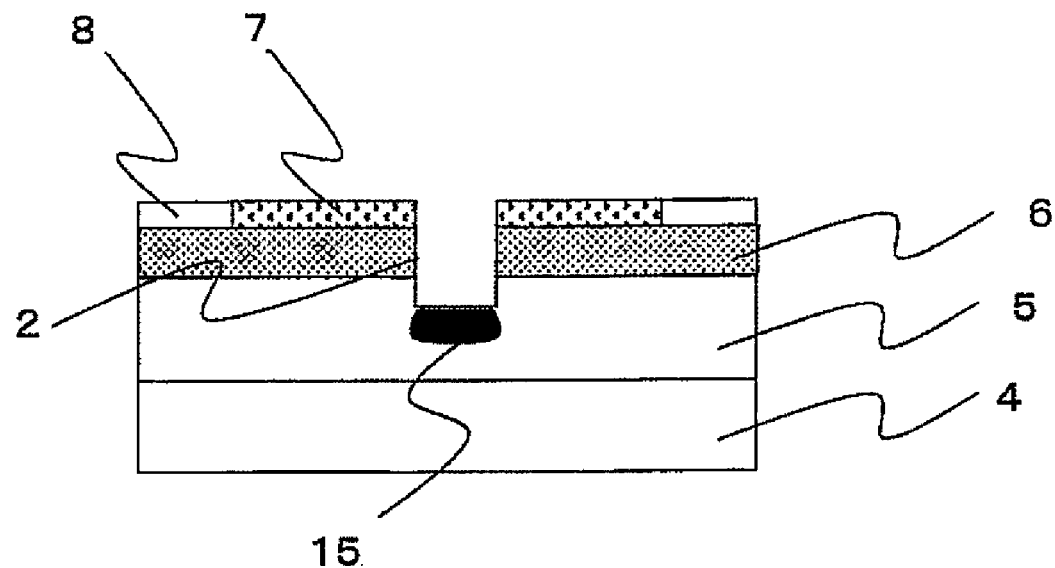
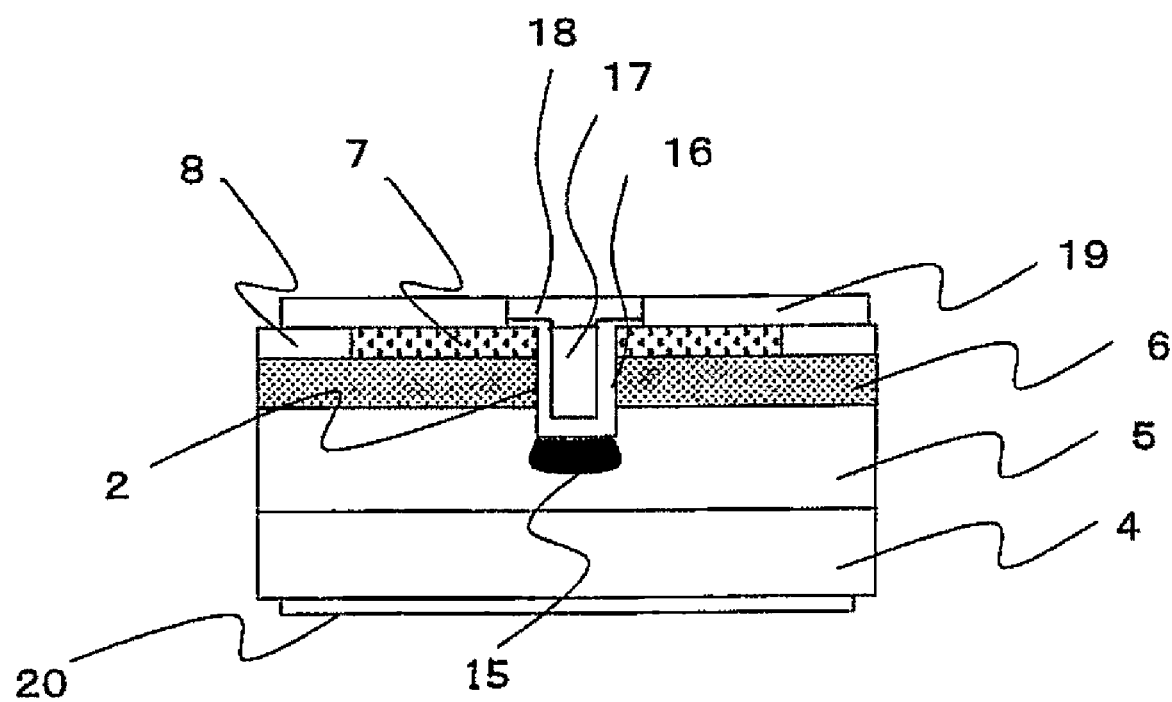
FIG. 12

METHOD OF MANUFACTURING SILICON CARBIDE SEMICONDUCTOR DEVICE

BACKGROUND

Semiconductor power devices, including a MOSFET power device and an IGBT power device, which employ silicon (hereinafter referred to sometimes as "Si") for the semiconductor material thereof, are devices typically used in inverters and apparatuses for electric power control. However, since the Si semiconductor properties have already reached the extremes of improvements thereof, the Si power devices exhibit almost the limit properties due to the physical properties of the semiconductor Si.

In contrast, since silicon carbide (hereinafter referred to as "SiC") exhibits excellent physical properties as described below, SiC (4H—SiC) is more advantageous than Si especially for the power device material. The electric field strength that causes a dielectric breakdown in SiC is 10 times as high as the electric field strength that causes a dielectric breakdown in Si. The band gap in SiC is 2.9 times as wide as the band gap in Si. The thermal conductivity in SiC is 3.2 times as high as the thermal conductivity in Si. The temperature, at which SiC becomes an intrinsic semiconductor, is 3 to 4 times as high as the temperature, at which Si becomes an intrinsic semiconductor. Since the power device that employs semiconductor SiC is expected to exhibit not only a high breakdown voltage but also low on-resistance, developments of many SiC power devices have been vigorously explored recently. SiC diodes and such SiC rectifying devices, as well as SiC transistors, SiC thyristors, and such SiC switching devices, have been fabricated experimentally. Among the SiC switching devices, a trench-type insulated-gate field-effect transistor (hereinafter referred to as a "UMOSFET") is attracting much attention especially as a device that facilitates further reduction of the resistance in the ON-state thereof, since the UMOSFET facilitates to increase the channel density by minimizing any of the trench gate structure thereof and the unit pattern thereof including a channel.

The SiC UMOSFET is manufactured in almost the same manner as a typical Si semiconductor device. Specifically, the SiC UMOSFET is manufactured in the form of an SiC semiconductor device of a trench-MOS-type by forming trenches in an SiC semiconductor substrate (hereinafter simply referred to sometimes as an "SiC substrate") by anisotropic etching, by removing the oxide film used for an etching mask, by forming gate insulator films, by filling the trenches with polycrystalline silicon that will work as gate electrodes, and by forming a source electrode and a drain electrode.

The SiC substrate is hard physically and stable chemically. Therefore, the SiC substrate is tough to etch. Therefore, the reactive ion etching (hereinafter referred to as the "RIE") used usually for forming trenches in a Si substrate is not employable for the mass-productive trench formation in the SiC substrate. For the mass-productive trench formation in the SiC substrate, there exists no way but to employ the physical etching (hereinafter referred to as the "dry etching") that bombards the SiC substrate with accelerated plasma ions to etch the surface thereof. As compared with the trench shape control performed by the RIE in the Si substrate, it is not so easy for the dry etching to form trenches having a good profile in the SiC substrate. For example, it is quite hard to form the trench bottom having a U-shape, which is preferable for the breakdown voltage characteristics of the semiconductor device, only using dry etching. It is also quite hard to provide the trench side wall with excellent smoothness only using dry etching. As illustrated in FIG. 6, which shows a cross-sectional view of a trench 2 of about 3 μm in thickness seen obliquely, an edge corner 10 in the opening 3 of the trench 2 is sharp. Protrusions, surface unevenness and such defective shapes are created on the side wall 11 and the bottom 12 of the trench 2. The electric field is liable to localize to the defective shapes formed in the trench 2 as described above, causing a low dielectric breakdown voltage.

The above-described defective shapes and such problems, generated in the process of forming the trenches via physical dry etching that bombards the SiC substrate with plasma particles accelerated at a high frequency under the reduced pressure, can be avoided by thermally treating the trench inner surface in a mixed gas atmosphere containing hydrogen gas (hereinafter referred to as "$H_2$ gas" or simply as "$H_2$") or argon gas (hereinafter referred to as "Ar gas" or simply as "Ar") at 1700° C. or lower. Alternatively, the above-described defective shapes and such problems may be avoided by etching the trench inner surface with $H_2$ at 1300° C. or higher under reduced pressure. The techniques described above for obviating the defective shapes and such problems are disclosed in Unexamined Japanese Patent Application Publication Nos. 2005-328013 and 2005-328014 (hereafter References 1 and 2).

It is known to the skilled persons in the art that smooth trench inner surfaces can be obtained in the Si semiconductor device by surface diffusing Si atoms, namely by annealing the Si semiconductor substrate with trenches formed therein in $H_2$. It is quite possible to control the inner surface shape and inner surface properties of the trench in the SiC semiconductor substrate by surface diffusion of the Si atoms. See Unexamined Japanese Patent Application Publication No. 2003-229479.

References 1 and 2 disclose methods for obviating the defective shapes generated in forming the trenches by employing $H_2$ at a high temperature. In the SiC substrate, not only silicon atoms but also carbon atoms exist in the trench inner surface as the composition elements. The carbon atoms are hazardous for the surface diffusion of Si atoms. Since it is hard to vigorously surface diffuse Si atoms, which is effective for smoothening the Si surface, in the SiC surface, the surface diffusion of Si atoms is not so effective to smoothen the SiC surface.

It has been found that the SiC surface can be etched more vigorously with high temperature $H_2$ than with the surface diffusion of the composition atoms in the SiC substrate. Nonetheless, it has been found that the etching of the SiC surface with high-temperature $H_2$ is hardly more controllable than the surface diffusion of the composition atoms in the SiC substrate. It has been found also that the high temperature treatment with $H_2$ is more influential on the trench shape control. Since the trench shape will be changed excessively if the treatment with high temperature $H_2$ is conducted without any modification, it is hard to employ the high temperature treatment with $H_2$ as a practical manufacturing method for improving the trench shape.

Accordingly, there still remains a need for a manufacturing method for smoothening the inner surface of a trench and for shaping or rounding the opening edge corner and the bottom corner of the trench to prevent the electric field from localizing, in forming the trench in an SiC substrate by dry etching. The present invention addresses this need.

SUMMARY OF THE INVENTION

The present invention relates to a method of manufacturing a semiconductor device, particularly to a manufacturing method that facilitates to improve the corner shapes and inner surface properties of the trench in a trench-type MOSFET and such a semiconductor power device made of a silicon carbide semiconductor, used for sustaining a high breakdown voltage and at high current flow.

The method of manufacturing a silicon carbide semiconductor device, which comprises a trench-type MOS-gate structure in a major surface thereof, includes forming a trench by dry etching, conducting a first heat treatment in an inert gas atmosphere or in a mixed gas atmosphere containing silane and the inert gas at a temperature between 1600° C. and 1800° C., and conducting a second heat treatment in a hydrogen gas atmosphere at a temperature between 1400° C. and 1500° C.

The inert gas can be selected from any of argon, helium, or neon. Alternatively, the inert gas can contain a gas mixture containing argon, helium, or neon. The first heat treatment and the second heat treatment can be conducted under a pressure between 30 Torr (30×133.322 Pa) and 760 Torr (760×133.322 Pa). The first heat treatment and the second heat treatment can be conducted continuously or consecutively in a same furnace.

BRIEF DESCRIPTION OF THE DRAWINGS

FIGS. 7-12 are cross-sectional views schematically illustrating the various stages during the manufacturing method of a MOSFET device incorporating a SiC layer.

DETAILED DESCRIPTION

Figure 1A:
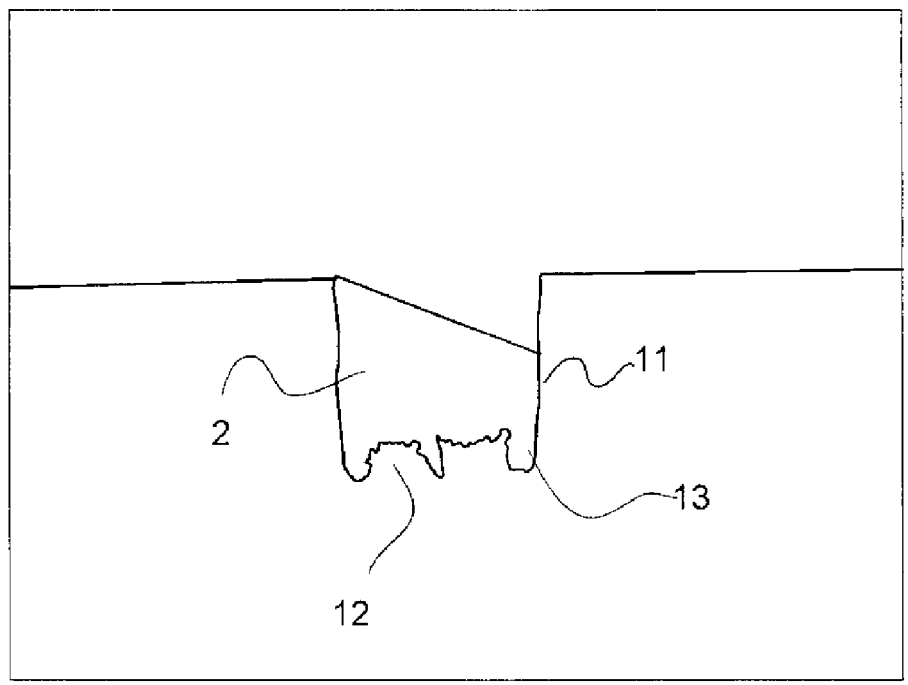
FIGS. 1A and 1B are cross-sectional views of a trench illustrating the effects of a two-step heat treatment according to the present method.

A method of manufacturing a semiconductor device according to the present invention follows in detail with reference to the accompanied drawings, which schematically illustrate the specific embodiments of a semiconductor device. In the drawings, numeral 1 denotes a SiC substrate, 2 denotes a trench, 3 denotes an opening, 4 denotes a substrate, 5 denotes an n-type SiC layer, 6 denotes a p-type SiC layer, 7 denotes an n-type source region, 8 denotes a p-type body contact region, 9 denotes a silicon oxide film, 10 denotes an edge corner of the trench opening, 11 denotes a trench side wall, 12 denotes a trench bottom, 13 denotes a sub-trench, 14 denotes aluminum, 15 denotes an Al ion implantation region, 16 denotes a gate insulating film, 17 denotes a gate, 18 denotes an interlayer insulating film, 19 denotes a source, and 20 denotes a drain.

The trench 2 is formed in the SiC substrate 1 by dry etching, and thereafter the internal surface shape and internal surface property of the trench are improved through the high-temperature heat treatment steps described below and conducted under the following conditions.

The SiC substrate (or SiC substrate with an epitaxial SiC film deposited thereon) is washed well. Then, an $SiO_2$ film 9 is deposited on the SiC substrate by chemical vapor deposition (hereinafter referred to as "CVD"). The substrate with the $SiO_2$ film deposited thereon is cleaned and dried in an oven furnace at 120° C. for 10 min. Then, the $SiO_2$ film surface is exposed to the vapor of hexamethyldisilazane (OAP supplied from TOKYO OHKA KOGYO CO., LTD.) to improve the affinity of the $SiO_2$ film with a photoresist. Then, the photoresist is coated on the $SiO_2$ film.

Then, the SiC substrate with the $SiO_2$ film and the photoresist thereon is left in the oven furnace at 100° C. for 10 min to bake the photoresist by a soft bake. After the soft bake, the $SiO_2$ film on the SiC substrate is exposed to an ultraviolet ray in a light exposing apparatus using a mask having a trench pattern formed therein. After the light exposure, the trench pattern is developed and the unnecessary portion of the photoresist is removed. Then, a photoresist pattern is formed by a hard bake conducted at 125° C. for 20 min. The photoresist after the hard bake is about 2.5 μm in thickness. The photoresist thick enough to survive the dry etching of the $SiO_2$ film poses no problem.

After forming the photoresist pattern, the $SiO_2$ film is dry etched to pattern the $SiO_2$ film, using the photoresist for a mask in an dry etching apparatus, into which a gas mixture containing $CHF_3$, $CF_4$, and Ar is fed, under the pressure of 7 Pa. After patterning, the photoresist is immersed in a pealing liquid to remove the photoresist. After washing with water and drying, the SiC substrate (or the SiC film) is etched by dry etching. The resulting trench of about 3 μm in width and about 3 μm in depth is formed by dry etching using the $SiO_2$ film as an etching mask in a dry etching apparatus, which employs inductively coupled plasma (hereinafter referred to as "ICP"), using a gas mixture containing $SF_6$, $O_2$, and Ar with the ICP power of 600 W, at the RF bias of 15 W and under the pressure of 0.4 Pa. After the trench formation, the $SiO_2$ film used for the etching mask is removed with hydrofluoric acid.

Figure 6:
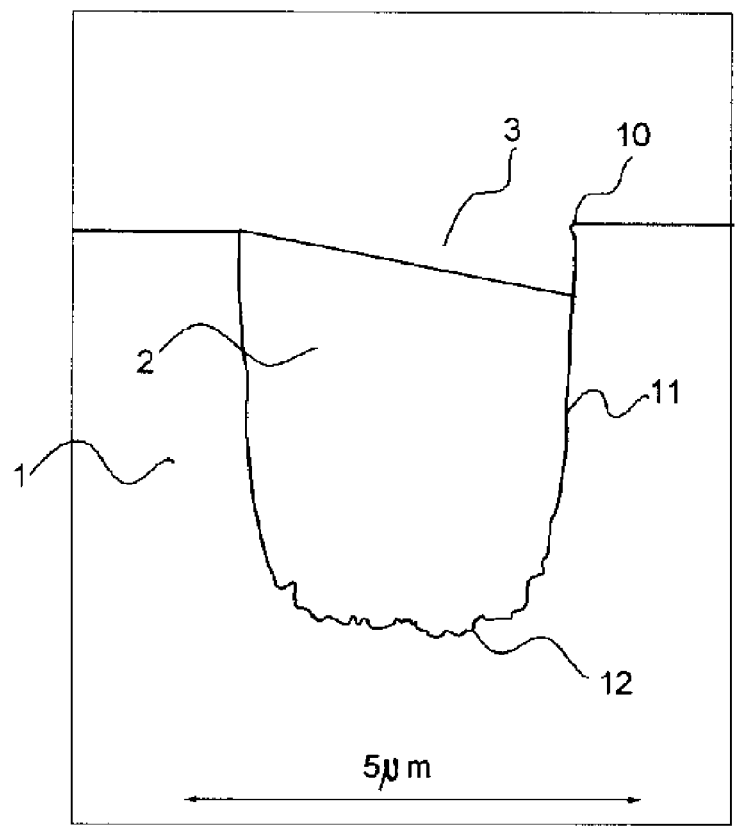
FIG. 6 is a cross-sectional view of the trench illustrating the trench immediately after the formation thereof in an SiC substrate by dry etching and before the heat treatment thereof.

FIG. 6 shows the cross-sectional view of the trench 2 formed as described above. The cross-sectional view of the trench is drawn by tracing the cross-sectional shape of the trench from a SEM photograph showing the cross section of the SiC substrate immediately after the trench is formed therein. In FIG. 6, the edge corner 10 in the opening 3 of the trench 2 is pointing almost at a right angle. The surface at the bottom 12 of the trench 2 is not smooth, but rather uneven. For investigating the conditions for shaping the trench inner surface to obviate the adverse effects on the breakdown voltage characteristics, heat treatments are conducted on the SiC substrate 1 with the trench shown in FIG. 6 under the various conditions described in Table 1.

TABLE 1

HEAT TREATMENT CONDITIONS

| Conditions | Temperatures(° C.) | Periods (min) | Gases | Pressures (Torr) |
|---|---|---|---|---|
| 1 | 1700 | 1 | Ar | 1.5 |
| 2 | 1700 | 1 | Ar | 80 |
| 3 | 1700 | 1 | Ar | 760 |
| 4 | 1500 | 1 | $SiH_4$ + Ar | 80 |
| 5 | 1600 | 1 | $SiH_4$ + Ar | 80 |

TABLE 1-continued

HEAT TREATMENT CONDITIONS

| Conditions | Temperatures(° C.) | Periods (min) | Gases | Pressures (Torr) |
|---|---|---|---|---|
| 6 | 1700 | 1 | $SiH_4 + Ar$ | 80 |
| 7 | 1800 | 1 | $SiH_4 + Ar$ | 80 |
| 8 | 1300 | 1 | $H_2$ | 80 |
| 9 | 1400 | 1 | $H_2$ | 80 |
| 10 | 1500 | 1 | $H_2$ | 80 |
| 11 | 1600 | 1 | $H_2$ | 80 |
| 12 | 1700 | 1 | $H_2$ | 80 |

Figure 2A:
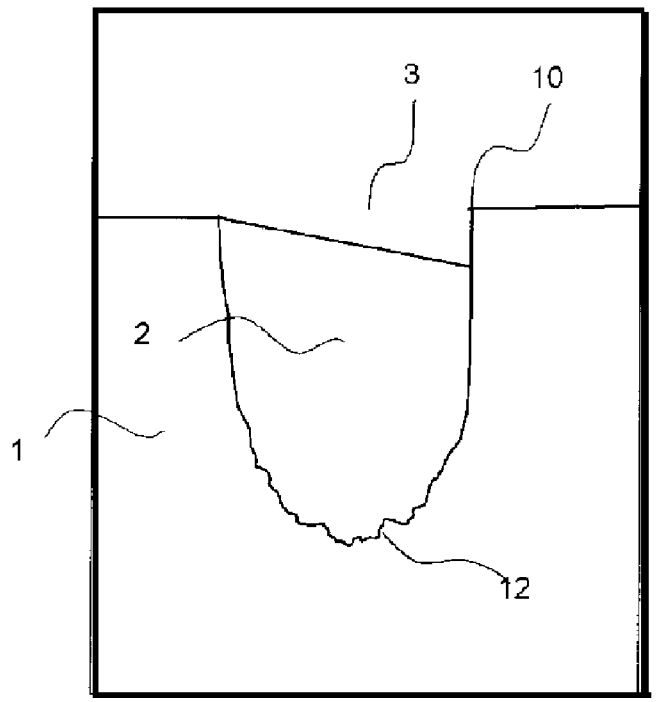
FIGS. 2A, 2B, 2C are cross-sectional views of the trench illustrating the trench that has been thermally treated at 1700° C. in an Ar gas atmosphere under various pressures.
Figure 2B:
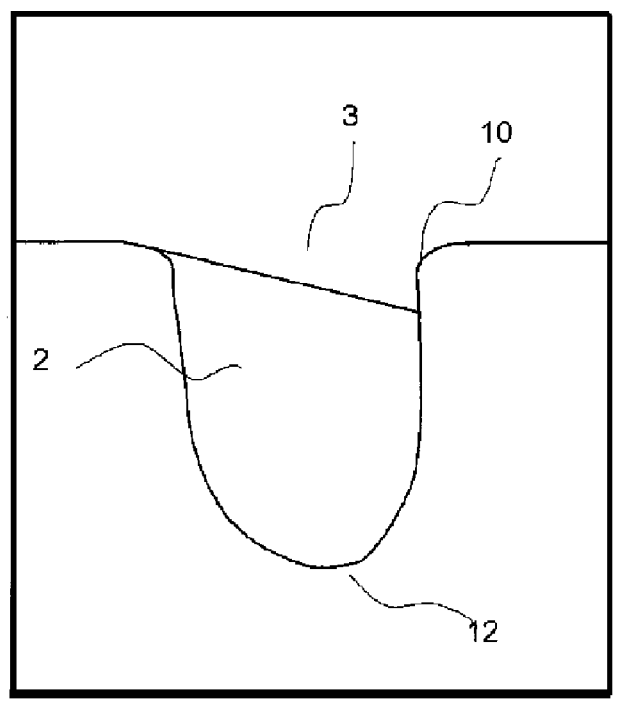
Figure 2C:
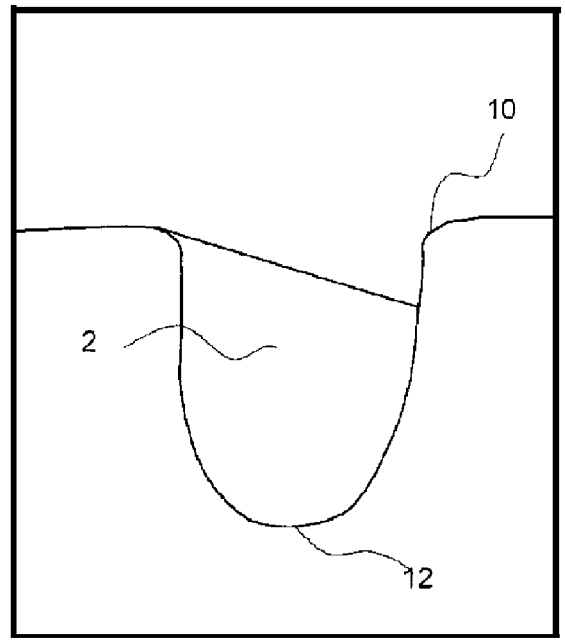

FIGS. 2A, 2B, 2C show the cross-sectional views of the trench dawn by tracing the trench shapes from the electron microscopic photographs (SEM photographs) of the trench treated in the Ar gas atmosphere under the conditions 1 through 3 listed in Table 1. The cross-sectional view of the trench shown in FIG. 2A indicates that no effective shape change is observed in the trench 2 when it is thermally treated under the low gas pressure of 1.5 Torr as compared with the shape of the trench immediately after the formation thereof shown in FIG. 6. The cross-sectional views of the trench shown in FIGS. 2B and 2C indicate that the edge corner 10 in the opening 3 of the trench 2 becomes rounded, the trench bottom 12 is smoothened such that the trench 2 has a U-shaped profile and the surface roughness of the trench bottom 12 is reduced remarkably in the SiC substrates treated thermally under the pressures of 80 Torr and the atmospheric pressure of 760 Torr, respectively. It has been found separately that it is necessary for the heat treatment gas pressure to be higher than 1.5 Torr and that it is preferable for the heat treatment gas pressure to be between 30 Torr, which is lower than 80 Torr, and 760 Torr.

Figure 4A:
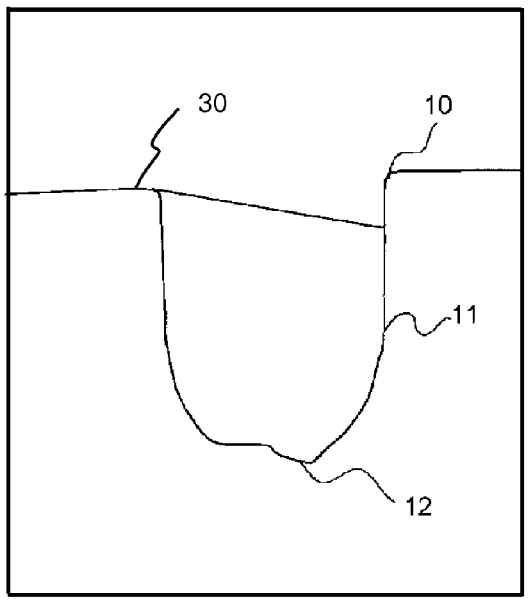
FIGS. 4A, 4B, 4C, 4D are cross-sectional views of the trench illustrating the trench that has been thermally treated in a mixed gas atmosphere containing $SiH_4$ and Ar at various temperatures.
Figure 4B:
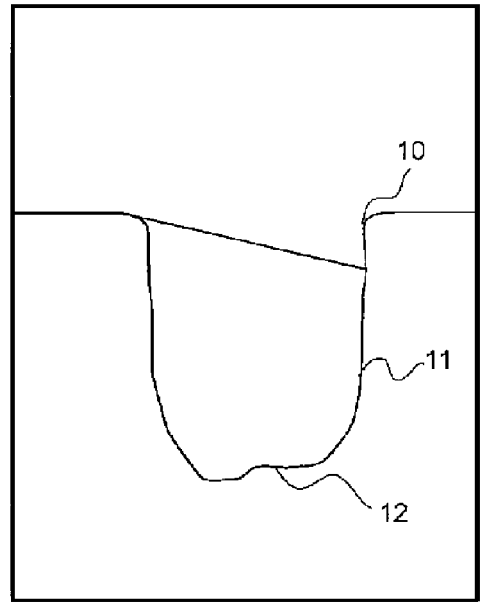
Figure 4C:
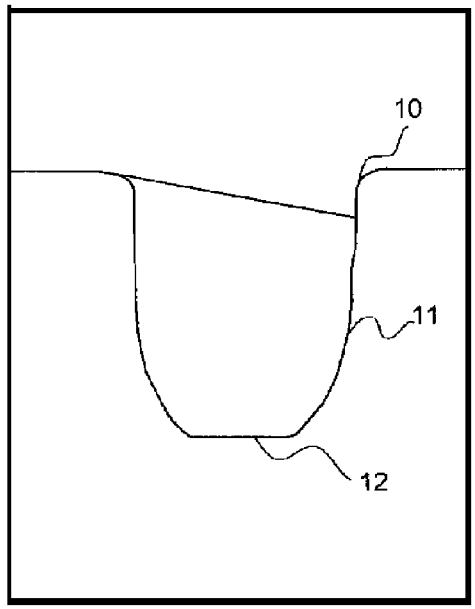
Figure 4D:
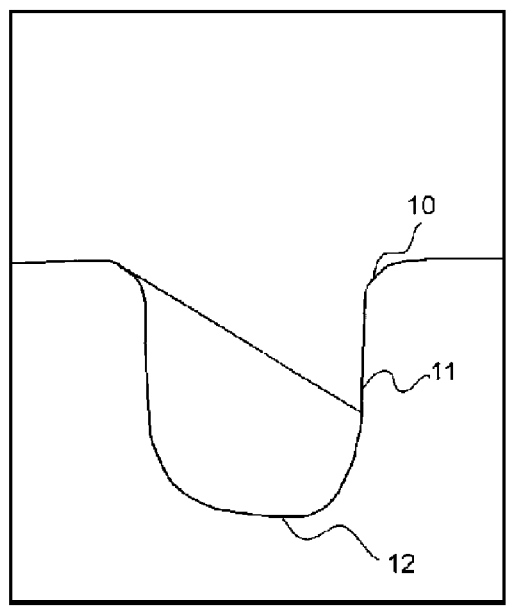

Table 2 shows the results of the heat treatment conducted on the SiC substrate 1 under the conditions 1 through 3 in comparison with the untreated SiC substrate (before the heat treatment), analyzed with an atomic force microscope (hereinafter referred to as an "AFM") and by the X-ray photoelectron spectroscopy (hereinafter referred to as the "XPS"). The surface roughness in the upper portion 30 (see FIG. 4A) of the substrate is analyzed by the AFM. The Si/C composition ratio is analyzed by the XPS.

TABLE 2

SURFACE ROUGHNESS AND COMPOSITION RATIOS UNDER VARIOUS PRESSURES

| Conditions | Temperatures (° C.) | Period (min) | Gases | Pressures (Torr) | Surface roughness (nm) | Si/C ratios |
|---|---|---|---|---|---|---|
| 1 | 1700 | 1 | Ar | 1.5 | RMS = 2.57 | 1/99 |
| 2 | 1700 | 1 | Ar | 80 | RMS = 4.65 | 50/50 |
| 3 | 1700 | 1 | Ar | 760 | RMS = 4.23 | 50/50 |
| Untreated | | | | | RMS = 0.33 | 50/50 |

As the Si/C composition ratio, that is 1/99, under the pressure of 1.5 Torr indicates, Si is vaporized from the SiC crystal surface by the heat treatment conducted under the condition 1. Since the XPS provides the composition data in the surface (around 2 nm), the crystal surface is occupied almost only by C. For avoiding the SiC composition change as described above, the pressure of 1.5 Torr is too low. In other words, it is necessary to raise the pressure to some degree.

Figure 3A:
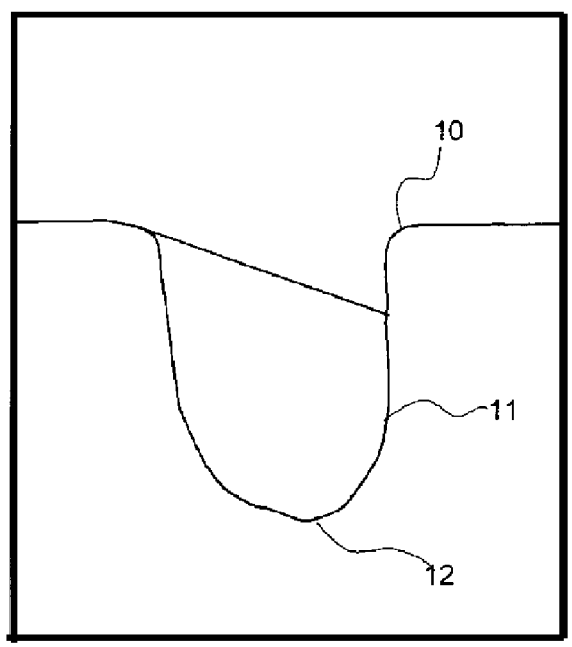
FIGS. 3A, 3B, 3C are cross-sectional views of the trench illustrating the trench that has been thermally treated in various gas atmospheres.
Figure 3B:
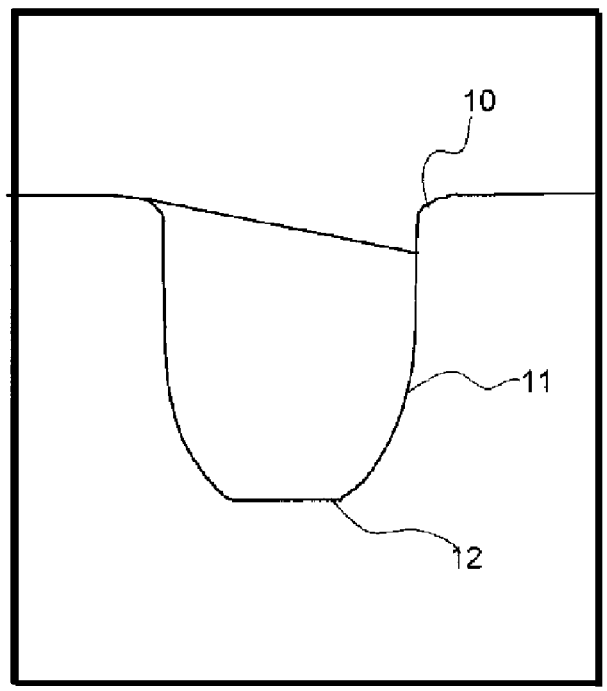
Figure 3C:
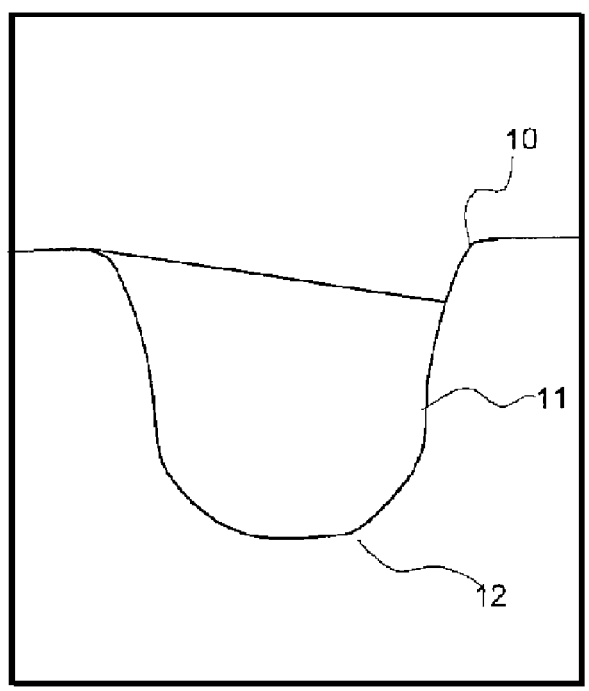

Under the heat treatment conditions 4 through 12, the heat treatment pressure is set at 80 Torr and the heat treatment gas is selected from the group consisting of a gas mixture of silane ($SiH_4$) and argon (Ar), and hydrogen ($H_2$). The cross-sectional shapes of the trenches in the SiC substrates thermally treated under the conditions 2, 6, and 12 are drawn by tracing the SEM cross section photographs and illustrated in FIGS. 3A, 3B, and 3C. The results analyzed by the AFM and the XPS for the heat treatment conditions 2, 6, and 12 are listed in Table 3. FIG. 3A illustrates the cross-sectional shape or profile of the trench treated under the condition 2. FIG. 3B illustrates the cross-sectional shape of the trench treated under the condition 6. FIG. 3C illustrates the cross-sectional shape of the trench treated under the condition 12.

TABLE 3

DEPENDENCE OF SURFACE ROUGHNESS AND COMPOSITION RATIOS ON GASES

| Conditions | Temperatures (° C.) | Period (min) | Gases | Pressures (Torr) | Surface roughness (nm) | Si/C ratios |
|---|---|---|---|---|---|---|
| 2 | 1700 | 1 | Ar | 80 | RMS = 4.65 | 50/50 |
| 6 | 1700 | 1 | $SiH_4 + Ar$ | 80 | RMS = 3.29 | 50/50 |
| 12 | 1700 | 1 | $H_2$ | 80 | RMS = 0.35 | 50/50 |

In the SiC substrates thermally treated in Ar and in a mixed gas atmosphere containing $SiH_4$ and Ar, the edge corner 10 pointed before the heat treatment as described in FIG. 6 becomes rounded and the surface smoothness of the trench side wall 11 and the surface smoothness of the trench bottom 12 are improved as described in FIGS. 3A and 3B, respectively. In the SiC substrate thermally treated in $H_2$ (condition 12), the surface smoothness is improved but the trench side wall becomes etched too much such that the trench is undesirably widened, indicating that the trench is etched too vigorously (over etched) as illustrated in FIG. 3C.

The measured surface roughness values analyzed by the AFM indicate that the heat treatment gases affect the surface roughness (RMS) (adversely affect the surface smoothness) in the upper portion of the substrate in the ascending order of $H_2 < SiH_4 + Ar < Ar$, further supporting that the heat treatment in $H_2$ improves the surface smoothness the most. Then, the heat treatment in the mixed gas atmosphere containing $SiH_4$ and Ar is further investigated. The heat treatment in the mixed gas atmosphere containing $SiH_4$ and Ar suppresses the trench shape change quite effectively while providing the surface smooth enough next to the surface treated in $H_2$.

The cross-sectional shapes of the trenches in the SiC substrates thermally treated under the conditions 4 through 7 are drawn by tracing the SEM photographs and illustrated in FIGS. 4A through 4D. The results analyzed by the AFM and the XPS for the heat treatment conditions 4 through 7 are listed in Table 4.

TABLE 4

TEMPERATURE DEPENDENCE OF SURFACE ROUGHNESS AND COMPOSITION RATIOS BY HEAT TREATMENTS IN MIXED GAS ATMOSPHERE CONTAINING $SIH_4$ AND AR

| Conditions | Temperatures (° C.) | Period (min) | Gases | Pressures (Torr) | Surface roughness (nm) | Si/C ratios |
|---|---|---|---|---|---|---|
| 4 | 1500 | 1 | $SiH_4 + Ar$ | 80 | RMS = 1.13 | 50/50 |
| 5 | 1600 | 1 | $SiH_4 + Ar$ | 80 | RMS = 1.31 | 50/50 |
| 6 | 1700 | 1 | $SiH_4 + Ar$ | 80 | RMS = 3.29 | 50/50 |
| 7 | 1800 | 1 | $SiH_4 + Ar$ | 80 | RMS = 6.24 | 50/50 |

As FIGS. 4A through 4D illustrate, the trench edge corner 10 becomes rounded more and the smoothness of the trench side wall 11 and the smoothness of the trench bottom 12 are improved more as the heat treatment temperature is raised from 1500° C. to 1800° C. However, as the measured surface roughness values (RMS values) in the upper portion of the substrate 30 listed in Table 4 indicate, the RMS value becomes higher as the heat treatment temperature becomes higher, further indicating that the surface unevenness becomes larger and the substrate surface smoothness becomes impaired more as the heat treatment temperature becomes higher. From the view point of improving the trench shape, the heat treatment in the mixed gas atmosphere containing $SiH_4$ and Ar does not adversely affect the trench shape and the surface properties independently of the heat treatment temperature, since the heat treatment in the mixed gas atmosphere containing $SiH_4$ and Ar rounds the corners in the trench appropriately but does not widen the trench too much.

The heat treatment conducted under the condition 12 (at 1700° C. in $H_2$) listed in Table 3 etches the trench too vigorously, increasing the width thereof greatly as illustrated in FIG. 3C. However, since the substrate surface smoothness obtained by the heat treatment conducted under the condition 12 is excellent, it is further investigated whether the heat treatment in $H_2$ conducted at a temperature lower than 1700° C. prevents over-etching to improve the trench shape and obtain excellent surface smoothness or not. The cross-sectional shapes of the trenches in the SiC substrates thermally treated under the conditions 8 through 12 are drawn by tracing the SEM photographs and illustrated in FIGS. 5A through 5E. The results analyzed by the AFM and the XPS for the heat treatment conditions 8 through 12 are listed in Table 5.

TABLE 5

TEMPERATURE DEPENDENCE OF SURFACE ROUGHNESS AND COMPOSITION RATIOS IN HEAT TREATMENTS IN $H_2$

| Conditions | Temperatures (° C.) | Period (min) | Gases | Pressures (Torr) | Surface roughness (nm) | Si/C ratios |
|---|---|---|---|---|---|---|
| 8 | 1300 | 1 | $H_2$ | 80 | RMS = 0.14 | 50/50 |
| 9 | 1400 | 1 | $H_2$ | 80 | RMS = 0.08 | 50/50 |
| 10 | 1500 | 1 | $H_2$ | 80 | RMS = 0.08 | 50/50 |
| 11 | 1600 | 1 | $H_2$ | 80 | RMS = 0.11 | 50/50 |
| 12 | 1700 | 1 | $H_2$ | 80 | RMS = 0.35 | 50/50 |

Figure 5A:
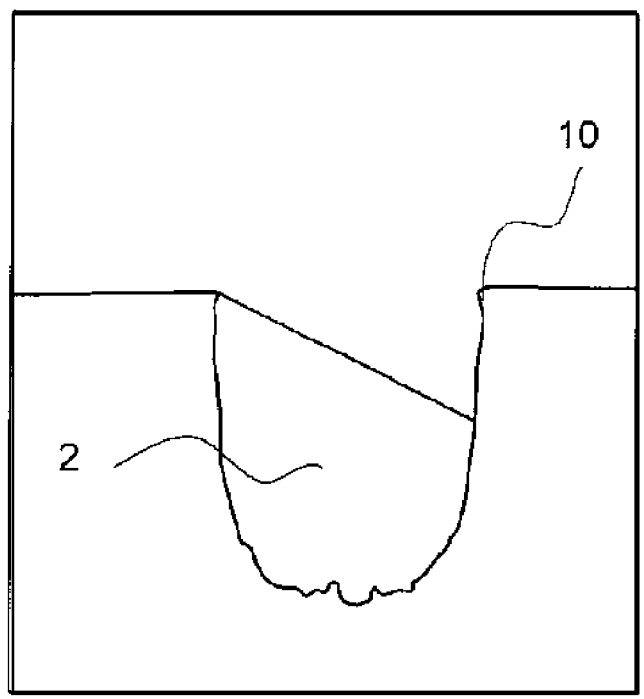
FIGS. 5A, 5B, 5C, 5D, 5E are cross-sectional views of the trench illustrating the trench that has been thermally treated at various temperatures in a high temperature hydrogen gas atmosphere.
Figure 5B:
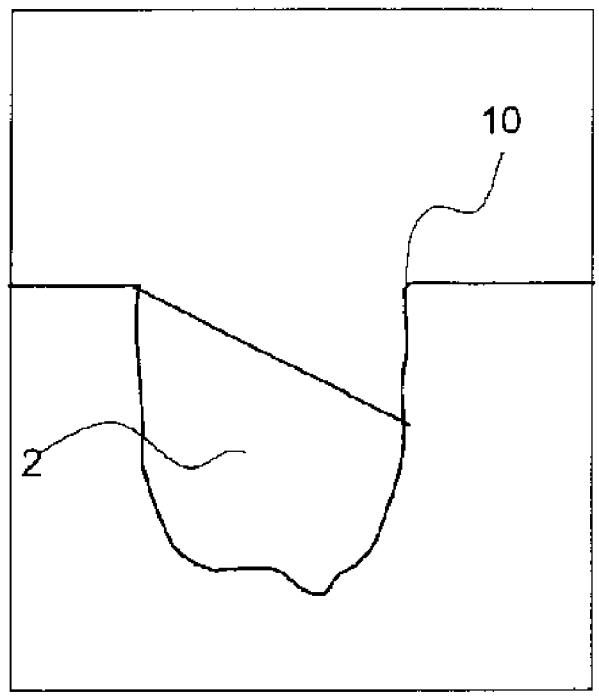
Figure 5C:
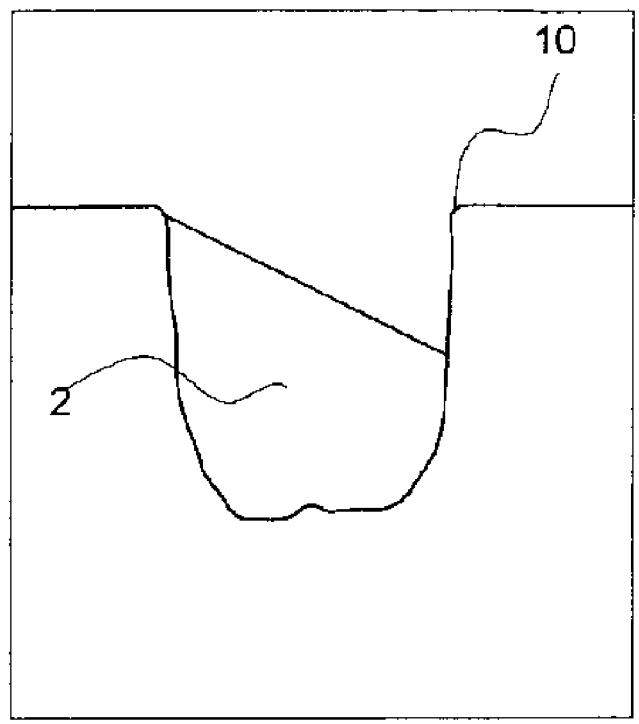
Figure 5D:
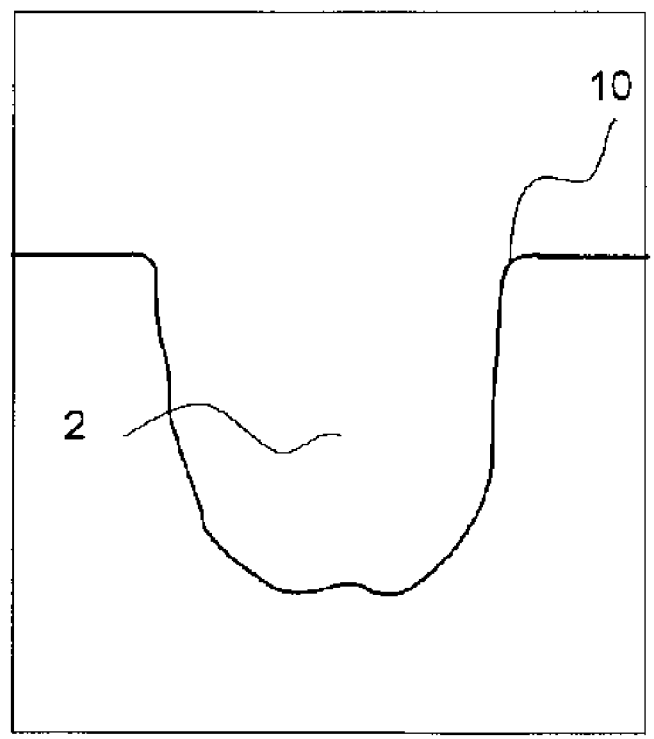
Figure 5E:
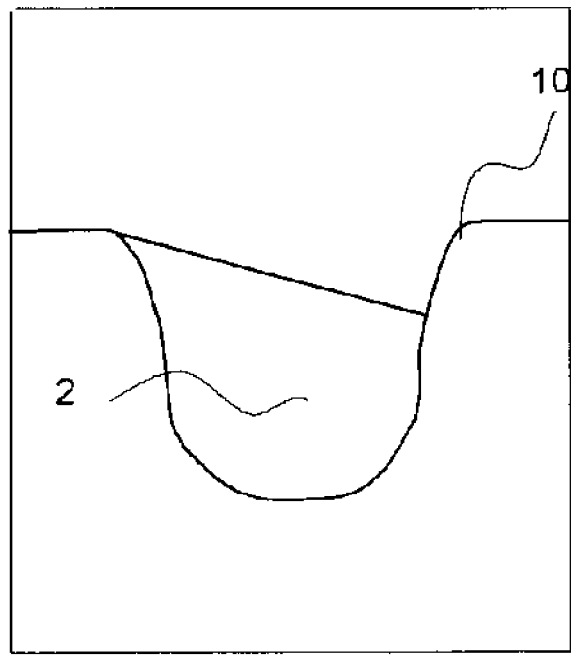

As FIG. 5A and Table 5 indicate, the heat treatment conducted at 1300° C. in the $H_2$ atmosphere does not much improve the shape and inner surface smoothness of trench 2 in comparison with the trench 2 illustrated in FIG. 6 before the heat treatment. As illustrated in FIGS. 5B and 5C, the roundness of the trench edge corner 10 and the smoothness of the trench side wall 11 are improved, but only slightly by the heat treatment conducted in the $H_2$ atmosphere at a temperature between 1400° C. and 1500° C. The shape change or the shape improvement obtained by the heat treatment conducted in the $H_2$ atmosphere at a temperature between 1400° C. and 1500° C. is less than the shape change or the shape improvement obtained by the heat treatment conducted in the mixed gas atmosphere containing $SiH_4$ and Ar. The heat treatment conducted at 1600° C. or higher in the $H_2$ atmosphere etches trench side wall 11 too much and widens trench 2 too much. This tendency is more remarkable in the SiC substrate thermally treated at 1700° C. in the $H_2$ atmosphere. The measurement of the surface roughness in the upper portion of the substrate by the AFM reveals that the RMS of the surface roughness in the upper portion of the substrate is 0.35 nm for the heat treatment conducted at 1700° C. in $H_2$. The measurement of the surface roughness by the AFM reveals also that the RMS of the surface roughness in the upper portion of the substrate is around 0.1 nm for the heat treatment conducted at 1600° C. or lower in the $H_2$ atmosphere. The heat treatment conducted at 1600° C. or lower in the $H_2$ atmosphere facilitates to obtain a very smooth substrate surface. Therefore, it is preferable to conduct the heat treatment in the $H_2$ atmosphere at a temperature between 1400° C. and 1500° C., by which trench side wall 11 is not etched too much.

As described above, the heat treatment in the mixed gas atmosphere containing $SiH_4$ and Ar at a temperature between 1700° C. and 1800° C. is preferable to round the trench edge corner, to smoothen the trench inner wall and form a U-shaped trench profile. However, the heat treatment conducted in the mixed gas atmosphere containing $SiH_4$ and Ar at a temperature between 1700° C. and 1800° C. is liable to roughen the substrate surface. The heat treatment in $H_2$ at 1600° C. or higher etches the trench side wall too much and widens the trench opening. The heat treatment in $H_2$ at 1600° C. or higher rounds the trench opening edge and the trench bottom corner not so effectively as expected. The smoothness of the trench inner wall obtained by the treatment in $H_2$ at 1600° C. or higher is insufficient. However, the unevenness in the substrate surface after the treatment in $H_2$ at 1600° C. or higher is very small.

Based on the characteristic features of the heat treatments described above, the heat treatment is divided into a first step conducted at 1700° C. in the mixed gas atmosphere containing $SiH_4$ and Ar and a second step conducted at 1500° C. in the $H_2$ atmosphere. The first and second steps are conducted continuously in the same furnace. After the first step of heat treatment is over, the temperature is lowered from 1700° C. to 1500° C. and the mixed gas atmosphere containing $SiH_4$ and Ar is changed over to the $H_2$ atmosphere. It is investigated whether the first step of heat treatment exhibits the effect of rounding the corners in the trench opening and the trench bottom and smoothening the trench inner wall or not. It is also investigated whether the second step of heat treatment exhibits the effect of smoothening the substrate surface or not.

Figure 1B:
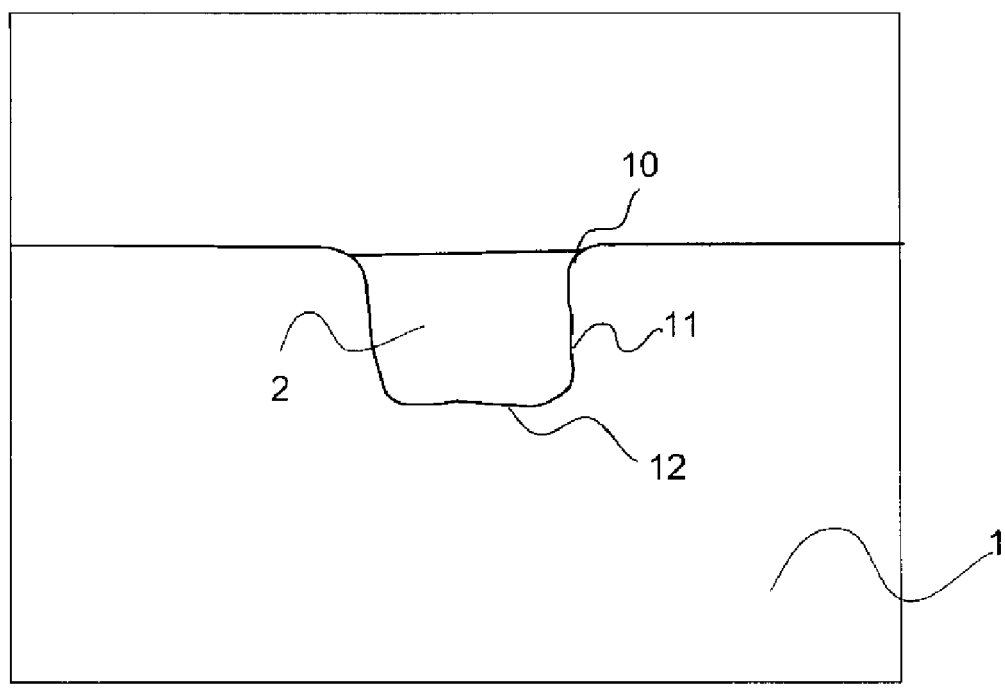

FIG. 1B is a cross-sectional view of a trench described by tracing the SEM cross section photograph of the trench formed by the two-step heat treatment according to the present method. Table 6 lists the results analyzed by the AFM. FIG. 1A is a cross-sectional view of the trench described by tracing the SEM cross section photograph of the trench before the two-step heat treatment for improving the trench shape.

TABLE 6

TWO-STEP HEAT TREATMENT CONDITIONS AND SURFACE ROUGHNESS

| Conditions | First step of heat treatment | Second step of heat Treatment | Surface roughness (nm) |
|---|---|---|---|
| 13 | In the gas mixture of $SiH_4$ and Ar at 1700° C. for 10 min under 80 Torr | In $H_2$ gas at 1500° C. for 10 min under 80 Torr | RMS = 0.20 |

As illustrated in FIG. 1A, sub-trenches 13, which are the recesses formed at the trench bottom, are formed in the trench 2 and the trench bottom 12 is largely uneven immediately after the formation of the trench 2 and before the heat treatment according to the present method. However, it has been found that the first step of heat treatment and the second step of heat treatment are very effective to improve the badly shaped trench as illustrated in FIG. 1A. In detail, the first step of heat treatment conducted in the mixed gas atmosphere containing $SiH_4$ and Ar at 1700° C. for 10 min rounds the opening edge corner 10 and the bottom corner of the trench 2 and improves the flatness of the trench inner wall 11. Then, the second step of heat treatment conducted in the $H_2$ atmosphere at 1500° C. for 10 min reduces the RMS of the substrate surface roughness to 0.2 nm.

As described in connection with the two-step heat treatment and based on the experimental data, the first step of heat treatment is conducted under the pressure inside a furnace of 30 Torr to 760 Torr in an Ar atmosphere or in a mixed gas atmosphere containing $SiH_4$ and Ar at a temperature between 1600° C. and 1800° C. to round the opening edge corner 10 and the bottom corner of the trench 2 formed in the SiC substrate 1 or in an SiC film and to smoothen the surface roughness in trench side wall 11 and the trench bottom 12. Then, the second step of heat treatment is conducted continuously to the first step of heat treatment in an $H_2$ atmosphere at a temperature between 1400° C. and 1500° C. to smoothen the surface of SiC substrate 1 and the trench inner wall. Since the pointed trench edge corner 10 is rounded and the surfaces of trench side wall 11 and the trench bottom 12 are smoothened in the SiC substrate, which is hard physically, stable chemically and hard to etch, an SiC power semiconductor device that does not cause electric field localization but exhibiting an excellent dielectric breakdown voltage can be obtained by the present manufactured method.

Although Ar is used as an inert gas in the above examples, a different inert gas, such as He and Ne, that does not react with the SiC substrate can be used alternatively. Moreover, $Si_2H_6$ gas can be used in substitution for the $SiH_4$ gas with no problem.

Figure 7:
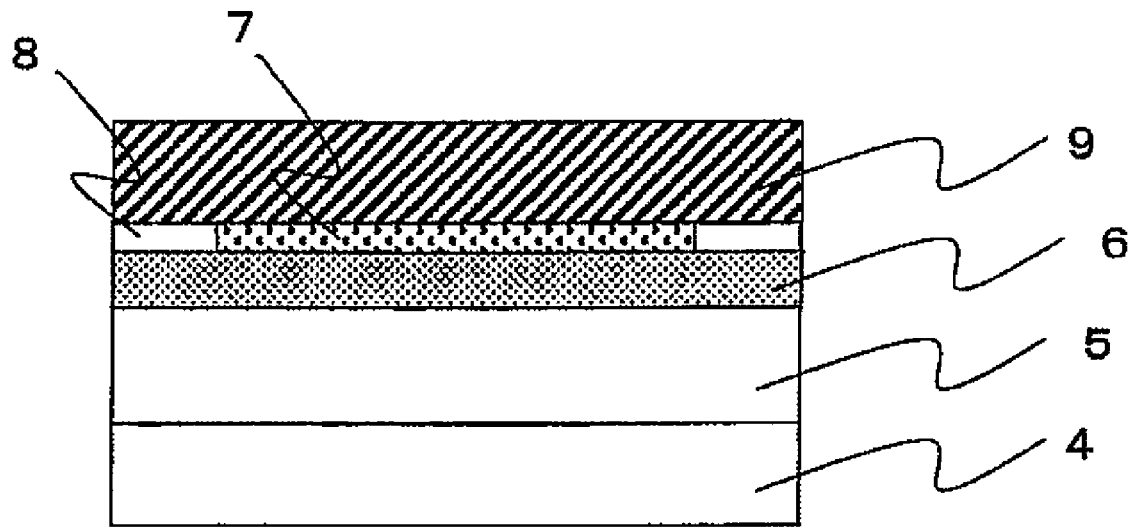
Figure 8:
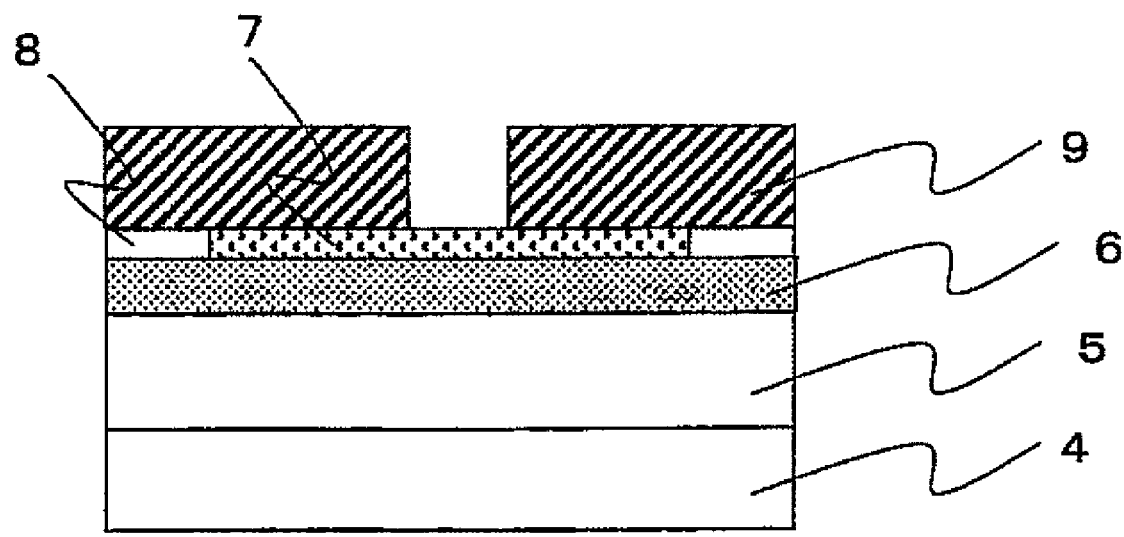

FIGS. 7-12 are cross-sectional views illustrating a method of forming a trench in a device active part of a trench MOSFET device. A substrate contains an n-type SiC substrate 4 having formed sequentially thereon by epitaxial growth an n-type SiC layer 5 having a low impurity content and a p-type SiC layer 6, and further formed thereon by ion implantation an n-type source region 7 and a p-type body contact region 8 having a high impurity content. A silicon oxide film 9 is accumulated on the substrate (FIG. 7). The silicon oxide film 9 on the source region 7 is patterned by photolithography (FIG. 8). A trench 2 reaching the n-type SiC layer 5 is then formed by reactive ion etching (RIE) or the like with a mask on the silicon oxide film 9 (FIG. 9). Subsequently, aluminum 14 (hereinafter, referred to as Al) is ion-implanted to the bottom of the trench with the silicon oxide film 9 as a mask (FIG. 10) to form an Al ion implantation region 15, and the silicon oxide film 9 used as a mask is removed with hydrofluoric acid or the like (FIG. 11). Thereafter, a process described later is conducted, i.e., annealing is conducted in an argon (Ar) reduced pressure atmosphere at 1,700° C. or higher, and then annealing is conducted in a hydrogen ($H_2$) reduced pressure atmosphere at 1,500° C. or lower. A gate insulating film 16, an interlayer insulating film 18 and electrodes for a gate 17, a source 19 and a drain 20 are then formed to provide a vertical trench MOSFET (FIG. 12).

Figure 13:
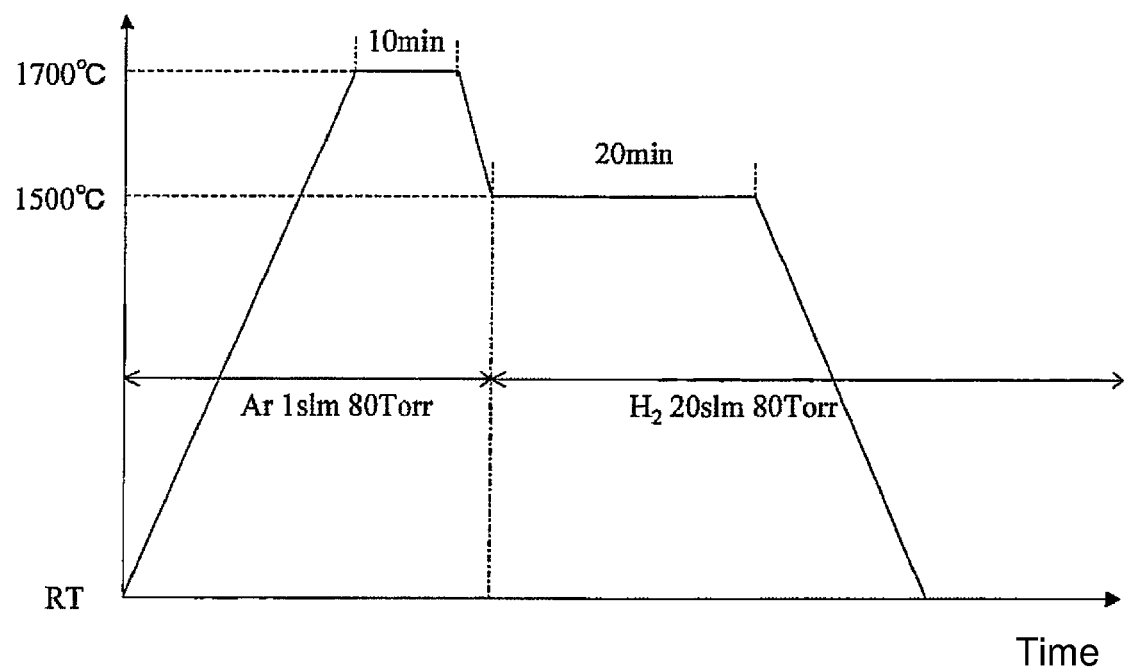
FIG. 13 is a graph illustrating the relationship among time, temperature, and gases in the annealing process of the manufacturing method of FIGS. 7-12.

The annealing step will be described in detail. A trench MOSFET having a design withstand voltage of 1,200 V was manufactured with an n-type 4H—SiC substrate with (000-1) plane and an off angle of 8° as an SiC substrate. After rinsing the SiC substrate 1 having the trench 2 shown in FIG. 11 with acid and alkali, the SiC substrate 1 was placed in an induction heating type heat treating furnace, which was then evacuated and replaced with an Ar atmosphere. Thereafter, the temperature was increased to 1,700° C. while maintaining the pressure to 80 Torr under an Ar stream of 1 slm. After maintaining 1,700° C. for 10 minutes, the temperature was decreased to 1,500° C., and the Ar stream is terminated. Under a $H_2$ stream of 20 slm instead, the temperature of 1,500° C. was maintained for 20 minutes while maintaining the pressure to 80 Torr. The temperature was then decreased to room temperature. The relationship among time, temperature, and gases in the process is shown in FIG. 13. Thereafter, after forming the gate insulating film 16, the trench 2 was filled with the gate 17 of polycrystalline silicon through the gate insulating film 16, and then the interlayer insulating film 18, the electrode for the source 19 and the drain 20 were formed to provide a trench MOSFET, as shown in FIG. 12. For comparison, another trench MOSFET was manufactured in the same manner except that the annealing shown in FIG. 13 was not conducted, and still another MOSFET was manufactured in the same manner except that the annealing was conducted at 1,700° C. under an Ar stream of 1 slm at a pressure of 80 Torr for 10 minutes without the $H_2$ annealing. Results of comparison of the trench MOSFETs for channel mobility are shown in Table 7 below.

TABLE 7

COMPARISON OF THE TRENCH MOSFETS FOR CHANNEL MOBILITY

| Annealing method | Channel mobility |
|---|---|
| No annealing | 10 cm2/V · s |
| 1,700° C. Ar Annealing | 15 cm2/V · s |
| 1,700° C. Ar Annealing + 1,500° C. $H_2$ Annealing | 45 cm2/V · s |

In the conventional manufacturing methods, the expected low on resistance has not been obtained due to the low channel mobility. The problem of low channel mobility occurs not only in the trench structure but also in the planer structure. In thermal oxidation of SiC, carbon remains at the interface between the oxide film and SiC, and thus is different from Si. The remaining carbon increases the interface state, which lowers the channel mobility. Ion implantation is used for controlling the local electroconductivity of SiC, and it is necessary to conduct high temperature annealing at 1,600° C. or higher for activating the impurities implanted. In annealing at a high temperature of 1,600° C. or higher, SiC is vaporized, roughening the surface thereof. The surface roughness scatters electrons, and the phenomenon induces decrease in channel mobility. In the trench MOSFET having been subjected to both the Ar annealing and the $H_2$ annealing, however, a high channel mobility was obtained. Result of comparison of the trench MOSFETs in Table 7 for withstand reverse voltage are shown in Table 8 below.

TABLE 8

COMPARISON OF THE TRENCH MOSFETS N TABLE 7 FOR WITHSTAND REVERSE VOLTAGE

| Annealing method | Withstand Reverse Voltage |
|---|---|
| No annealing | 200 V |
| 1,700° C. Ar Annealing | 1,200 V |
| 1,700° C. Ar Annealing + 1,500° C. $H_2$ Annealing | 1,200 V |

In the conventional manufacturing methods, a high withstand voltage has not been obtained due to the shortage in withstand voltage of the oxide film on the trench bottom. While SiC withstands to an electric field intensity larger by one order than Si, the oxide film is firstly broken at the part where the electric field is concentrated, such as the trench corners, in the strong electric field although SiC has high durability. It has been investigated to provide a p+ region on the trench bottom by ion implantation or the like to avoid the problem. The p+ region on the trench bottom is necessarily annealed at a high temperature to electrically activate the implanted ion upon practical use, and therefore, decrease in channel mobility due to the surface roughening cannot be avoided. In the above MOSFET example having been subjected to both the Ar annealing and the $H_2$ annealing, however, a high withstand reverse voltage as designed was obtained. For investigating why the high channel mobility and the high withstand reverse voltage in the sample having been subjected to both the Ar annealing and the $H_2$ annealing, a further experiment was conducted by using an n-type 4H—SiC substrate with (000-1) plane and an off angle of 8°.

The trench MOSFETs having been manufactured by annealing in the aforementioned conditions were compared for surface roughness on the trench side wall. A root mean square roughness of a 1 μm square area on the trench side wall was measured with an atomic force microscope. The results are shown in Table 9.

TABLE 9

COMPARISON OF THE TRENCH MOSFETS FOR SURFACE ROUGHNESS

| Annealing method | Square Surface Roughness of Trench Side Wall |
| --- | --- |
| No annealing | 15.2 nm |
| 1,700° C. Ar Annealing | 10.2 nm |
| 1,700° C. Ar Annealing + 1,500° C. $H_2$ Annealing | 1.4 nm |

The smallest roughness on the trench side wall was obtained when both the Ar annealing at 1,700° C. and the $H_2$ annealing at 1,500° C. were conducted. It has been known that SiC is etched on the surface thereof by annealing at a high temperature in $H_2$, and the $H_2$ annealing in the embodiment is conducted at a low temperature of 1,500° C. or lower for minimizing the etching amount. This is because the trench is prevented from being changed in shape thereof, and the source region and the like formed on the surface of the device are prevented from being ground off, due to etching. As confirmed by a separate experiment, the etching amount due to the $H_2$ annealing in the embodiment was 0.1 μm or less. It is considered that the reduction of the surface roughness on the trench side wall in the annealing, induced the improvement of the channel mobility.

The samples were then subjected to compositional analysis on the surface thereof after annealing. The compositional analysis was conducted by X-ray photoelectron spectroscopy. Comparison with respect to the annealing conditions was conducted for the compositional ratio of oxygen atoms and silicon atoms bonded thereto (Si($SiO_2$)), which indicated the abundance ratio of the silicon oxide film. The results are shown in Table 10.

TABLE 10

COMPARISON OF THE TRENCH MOSFETS FOR COMPOSITIONAL RATIO OF SI($SIO_2$)

| Annealing method | Compositional Ration of Si(SiO2) |
| --- | --- |
| No annealing | 0.1% or less |
| 1,700° C. Ar Annealing | 5.6% |
| 1,700° C. Ar Annealing + 1,500° C. $H_2$ Annealing | 0.4% |

The sample without annealing had no silicon oxide film on the surface thereof since it was washed with hydrofluoric acid before measurement. However, the sample subjected to the Ar annealing had a silicon oxide film formed on the surface thereof. It is considered that OH groups and the like, which have terminated dangling bonds on the surface, are released through the Ar annealing at high temperature to form a considerably active surface, which is then in contact with the air after completing the annealing to form immediately a silicon oxide film through formation of bonds with oxygen. The sample subjected to the Ar annealing and then the $H_2$ annealing has no silicon oxide film on the surface thereof. It is considered that even though the considerably active surface is formed through the Ar annealing, the dangling bonds are again terminated with hydrogen during the subsequent $H_2$ annealing. As having been described above, when a silicon oxide film is formed in the air, contaminants in the air are entrained therein. The contaminants may remain on the surface even after rinsing, and can increase the interface state to decrease the channel mobility. In the annealing process of the embodiment, a silicon oxide film is suppressed from being formed to protect the trench side wall from being contaminated, so that the channel mobility can be improved.

The samples having Al ions implanted in a dose of $1 \times 10^{15}$ $cm^{-2}$ were compared for electric activation rate after annealing. The results of measurement of activation rate are shown in Table 11. The activation rate was obtained by dividing the carrier density obtained by the Hall effect by the Al atom density obtained by the SIMS measurement.

TABLE 11

COMPARISON OF THE TRENCH MOSFETS FOR ACTIVATION RATE

| Annealing method | Activation Rate |
| --- | --- |
| No annealing | 10% or less |
| 1,700° C. Ar Annealing | 90% or more |
| 1,700° C. Ar Annealing + 1,500° C. H2 Annealing | 90% or more |

The sample without annealing was not electrically activated since Al ions implanted were not placed in the lattice positions. Accordingly, it was considered that the ion implanted region on the trench bottom was not formed at a sufficient concentration to fail to provide a high withstand voltage of the trench MOSFET. In the sample subjected to the Ar annealing at 1,700° C. and the sample subjected to both the Ar annealing at 1,700° C. and the $H_2$ annealing at 1,500° C., however, it was considered that Al ions implanted were sufficiently activated to form a p+ region on the trench bottom, which provide a high withstand voltage. It was found from results of a separate experiment that it was necessary to conduct annealing at a high temperature of 1,700° C. or higher in an Ar atmosphere after ion implantation for forming a p+ region on the trench bottom to provide a high withstand voltage.

The samples after annealing were compared for the shape of the trench. The sample without annealing had sharp trench corners. In the sample subjected to the Ar annealing at 1,700° C. and the sample subjected to both the Ar annealing at 1,700° C. and the $H_2$ annealing at 1,500° C., however, the trench corners were rounded through migration of the surface atoms at a high temperature on annealing. It was considered that the rounded trench corners induced a high withstand voltage of the trench MOSFET. This is because when the trench corners are sharp, an electric field is concentrated thereto to bring about decrease in withstand voltage of the oxide film, but when the trench corners are appropriately rounded, no concentration of an electric field occurs to provide a high withstand voltage.

It was understood from the results that in the sample subjected to both the Ar annealing at 1,700° C. and the $H_2$ annealing at 1,500° C., a high channel mobility was obtained with the decrease in surface roughness on the trench side wall and the clean surface of the trench side wall, and a high withstand reverse voltage was obtained with the high activation rate of Al ions implanted to the trench bottom and the rounded trench corners. The same advantages are obtained by conducting the Ar annealing at 1,700° C. and the $H_2$ annealing at 1,500° C. in a separate heat treating furnaces, respectively, but it is preferred for improving the process efficiency that they are conducted continuously in one heat treating furnace.

In conducting the Ar annealing described above in the method, roughening can occur on the surface of SiC having ions implanted to a high concentration, such as a dose of $1\times10^{16}$ cm$^{-2}$ or more. It is considered this to be because the SiC surface damaged by ion implantation is vaporized on annealing at a high temperature. In this case, monosilane gas ($SiH_4$) can be added to the gas as was previously described. Roughening the surface is suppressed by a partial pressure of Si generated in the atmosphere through decomposition of the monosilane gas. In this case, the compositional ratio of the silicon oxide film on the surface, the activation rate of Al ions implanted and the roundness of the trench corners are the same as previously described and are not influenced by the addition of monosilane gas. While monosilane gas can be used, the same advantages can also be obtained with disilane gas ($Si_2H_6$).

Metallic contamination on the trench inner wall can be removed by adding an appropriate amount of hydrogen chloride gas (HCl) on conducting the $H_2$ annealing. In this case, the compositional ratio of the silicon oxide film on the surface, the activation rate of Al ions implanted and the roundness of the trench corners can be the same as previously described, and are not influenced by the addition of hydrogen chloride gas. However, since the etching amount of SiC is increased by the addition of hydrogen chloride gas, it is necessary to control the temperature and time of annealing to such a combination that suppresses the etching amount to an extent not affecting the device characteristics (0.1 μm or less).

Annealing in an $H_2$ atmosphere can be conducted after annealing in an Ar atmosphere to achieve a high channel mobility and a high withstand reverse voltage for a trench MOSFET device. Accordingly, a switching device having a low loss and a high withstand voltage can be obtained by enjoying the material characteristics of SiC.

In forming a trench in a silicon carbide (SiC) semiconductor substrate by dry etching, the present method of manufacturing an SiC semiconductor device facilitates to smoothen the inner surface properties of the trench while rounding or shaping any sharp opening edge corner and bottom corner of the trench to prevent the electric field from localizing thereto. The present method thus can form a semiconductor device with a high channel mobility and a high withstand reverse voltage.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Patent Application Nos. 2006-344802, filed on 21 Dec. 2006, and 2007-294194 filed 13 Nov. 2007. The disclosures of the priority applications, in their entirety, including the drawings, claims, and the specifications thereof, are incorporated herein by reference.

What is claimed is:

1. A method of manufacturing a silicon carbide semiconductor device comprising a trench-type MOS-gate structure in a major surface thereof, the method comprising the steps of:
   forming a trench by dry etching;
   conducting a first heat treatment in an inert gas atmosphere consisting essentially of argon or in a mixed gas atmosphere consisting essentially of silane and argon at a temperature between 1600° C. and 1800° C.; and
   conducting a second heat treatment in a hydrogen gas atmosphere consisting essentially of hydrogen at a temperature between 1400° C. and 1500° C.

2. The method according to claim 1, wherein the first heat treatment and the second heat treatment are conducted under a gas pressure between 30 Torr and 760 Torr.

3. The method according to claim 1, wherein the first heat treatment and the second heat treatment are conducted continuously in a same furnace.

4. The method according to claim 2, wherein the first heat treatment and the second heat treatment are conducted continuously in a same furnace.

* * * * *